(12) United States Patent
Lalithambika et al.

(10) Patent No.: US 7,733,098 B2
(45) Date of Patent: Jun. 8, 2010

(54) SATURATION DETECTION CIRCUITS

(75) Inventors: Vinod A. Lalithambika, Cambridge (GB); Niek van der Duijn Schouten, Cambridge (GB); A. Johannes Schiff, Cambridge (GB)

(73) Assignee: Cambridge Semiconductor Limited, Cambridge, Cambridgeshire (GB)

( * ) Notice: Subject to any disclaimer, the term of this patent is extended or adjusted under 35 U.S.C. 154(b) by 723 days.

(21) Appl. No.: 11/641,195

(22) Filed: Dec. 19, 2006

(65) Prior Publication Data

US 2007/0200590 A1 Aug. 30, 2007

Related U.S. Application Data

(60) Provisional application No. 60/756,527, filed on Jan. 5, 2006.

(30) Foreign Application Priority Data

Dec. 22, 2005 (GB) .................................. 0526105.2

(51) Int. Cl.
   *G01R 27/08* (2006.01)
(52) U.S. Cl. ....................................... 324/713; 324/705
(58) Field of Classification Search .................. 324/133, 324/76.11, 761, 765, 158.1, 705, 713
   See application file for complete search history.

(56) References Cited

U.S. PATENT DOCUMENTS

| | | |
|---|---|---|
| 4,109,194 A | 8/1978 | Miller |
| 4,356,542 A | 10/1982 | Bruckner et al. |
| 4,994,955 A | 2/1991 | Schoofs et al. |
| 5,068,571 A | 11/1991 | Schoofs |
| 5,274,274 A | 12/1993 | Leman et al. |
| 5,479,090 A | 12/1995 | Schultz |
| 5,568,044 A | 10/1996 | Bittner |
| 5,631,494 A | 5/1997 | Sakurai et al. |

(Continued)

FOREIGN PATENT DOCUMENTS

DE 195 15 210 A1 10/1996

(Continued)

OTHER PUBLICATIONS

Matsuo, H., et al., "Novel digital controller for the PWM and/or PFM controlled switching DC-DC converters," Telecommunications Energy Conference, 1998, Intelec. 20$^{th}$ Int'l, San Francisco, CA, pp. 225-230.

(Continued)

*Primary Examiner*—Vincent Q Nguyen
(74) *Attorney, Agent, or Firm*—Knobbe, Martens, Olson & Bear LLP

(57) ABSTRACT

This invention generally relates to saturation detection circuits, in embodiments for substantially lossless detection of saturation of power switches in power integrated circuits. We describe a saturation detection circuit for detecting saturation of a power semiconductor device, the circuit including a said power semiconductor device having an input terminal and an output terminal, a second semiconductor device connected across said input and output terminals of the power semiconductor device, and a circuit responsive to a current flowing through the second semiconductor device to detect the saturation of the power semiconductor device.

2 Claims, 1 Drawing Sheet

U.S. PATENT DOCUMENTS

| | | |
|---|---|---|
| 5,631,550 A | 5/1997 | Castro et al. |
| 5,656,968 A | 8/1997 | Sander et al. |
| 5,737,169 A | 4/1998 | Sellers |
| 5,757,625 A | 5/1998 | Schoofs |
| 5,892,672 A | 4/1999 | Preller |
| 5,936,852 A | 8/1999 | Weinmeier et al. |
| 6,005,377 A | 12/1999 | Chen et al. |
| 6,037,720 A | 3/2000 | Wong et al. |
| 6,137,696 A | 10/2000 | Hall et al. |
| 6,252,436 B1 * | 6/2001 | Miettinen .................... 327/88 |
| 6,275,018 B1 | 8/2001 | Telefus et al. |
| 6,304,473 B1 | 10/2001 | Telefus et al. |
| RE37,609 E | 3/2002 | Bittner |
| 6,362,679 B2 | 3/2002 | Wile |
| 6,396,718 B1 | 5/2002 | Ng et al. |
| 6,703,684 B2 | 3/2004 | Udrea et al. |
| 6,781,422 B1 | 8/2004 | Yang |
| 6,781,423 B1 | 8/2004 | Knoedgen |
| 6,897,492 B2 | 5/2005 | Ochi |
| 2002/0057080 A1 | 5/2002 | Telefus et al. |
| 2002/0097008 A1 | 7/2002 | Krummel |
| 2004/0037094 A1 | 2/2004 | Muegge et al. |
| 2004/0174722 A1 | 9/2004 | Kunii |
| 2004/0227539 A1 | 11/2004 | Thiery |
| 2005/0052249 A1 | 3/2005 | Gan et al. |
| 2005/0270008 A1 | 12/2005 | Kuo |

FOREIGN PATENT DOCUMENTS

| | | |
|---|---|---|
| EP | 0 287 109 A2 | 10/1988 |
| EP | 0 516 848 A1 | 12/1992 |
| EP | 0 874 446 A1 | 10/1998 |
| EP | 0 993 105 A1 | 4/2000 |
| EP | 1 087 508 A1 | 3/2001 |
| EP | 1 213 822 A1 | 6/2002 |
| JP | 2004/236461 | 8/2004 |
| WO | WO 03/050637 A2 | 6/2003 |
| WO | WO 03/055072 A1 | 7/2003 |
| WO | WO 2006/067522 A3 | 6/2006 |
| WO | WO 2006/067523 A3 | 6/2006 |

OTHER PUBLICATIONS

The Non-Final Office Action dated Aug. 7, 2009 issued in Publication No. 2009-0263271.

* cited by examiner

SATURATION DETECTION CIRCUITS

CROSS-REFERENCE TO RELATED APPLICATIONS

This application claims priority to United Kingdom Patent Application No. 0526105.2, filed Dec. 22, 2005, which is incorporated in its entirety by reference herein. This application also claims benefit of U.S. Provisional Patent Application No. 60/756,527, filed Jan. 5, 2006, which is incorporated in its entirety by reference herein.

BACKGROUND OF THE INVENTION

1. Field of the Invention

This invention generally relates to saturation detection circuits, in embodiments for substantially lossless detection of saturation of power switches in power integrated circuits.

2. Description of the Related Art

There are many types of power semiconductor devices which may be used for power switching including, for example, power MOSFETs (Metal Oxide Semiconductor Field Effect Transistors) and Insulated Gate Bipolar Transistors (IGBTs). Broadly speaking when we refer to power devices we are generally referring to devices which are suitable for operating with a voltage of greater than 100 volts and of powers greater than 1 watt. Such power semiconductor devices may be incorporated into hybrid circuits and, more particularly, into power integrated circuits. In this latter case the power device often operates alongside low voltage devices performing a driver and/or control function. The low voltage circuitry is typically constructed using CMOS (Complementary Metal Oxide Semiconductor), bipolar or BiCMOS technology; the high voltage circuitry generally employs junction-isolation (JI) or semiconductor-on-insulator (SOI) technology.

A particularly advantageous form of construction for a power semiconductor device is described in the applicant's patents WO 02/25700, U.S. Pat. No. 6,703,684 and equivalents of an application derived from these patents, all of which are hereby incorporated by reference in their entirety. Broadly speaking these describe a power semiconductor device including a drift region in a membrane spaced away from the semiconductor substrate.

One method of current sensing in a power integrated circuit employs an on-chip or off-chip current sense resistor coupled to a comparator/reference circuit, but this technique is not able to protect a power switch such as an LIGBT (Lateral IGBT) or MOSFET from going into saturation. Furthermore power losses in the current sense resistor can be significant at higher powers. Generally the sense resistor also needs to be outside the power integrated circuit (IC). Thus although measuring the current through a current shunt resistor in the drain/emitter leg of a power device is straightforward to implement, it has a number of drawbacks.

Another technique is to employ a small parallel mirror switch with a current sense resistor in its source/emitter leg. This provides significantly reduced power consumption and enables the current sense finger to be monolithically integrated but still does not allow saturation to be detected. The data sheet of the Fairchild semiconductor FSDM311 power switch shows a circuit which appears to use this type of approach.

A further approach, used by Power Integrations, Inc. employs on-chip current sensing in which a lateral power MOSFET is provided with a low voltage tap in its drift region. This allows the on-state voltage of the device to be measured which (because of the on-state drain-source resistance of the MOSFET) is proportional to the current through the power switch.

Further background prior art can be found in: U.S. Pat. No. 5,631,494; US2004/0227539; EP0 516 848A; U.S. Pat. No. 5,656,968; and U.S. Pat. No. 5,737,169.

When a power semiconductor device goes into saturation its on-state voltage increases dramatically with very small increases in current. The power losses associated with this saturation can seriously damage or destroy the power device, especially in power integrated circuits where the power devices are generally less robust than discrete devices, and are often operated at their maximum ratings.

There is therefore a need for improved current sensing techniques, in particular improved techniques to enable saturation of a power switching device to be detected.

SUMMARY OF THE INVENTION

We will describe a technique which allows measurement of the on-state voltage of a power semiconductor switching device, which is related to the current passing through the device.

According to a first aspect of the invention there is therefore provided a saturation detection circuit for detecting saturation of a power semiconductor device, the circuit comprising a said power semiconductor device having an input terminal and an output terminal, a second semiconductor device connected across said input and output terminals of said power semiconductor device, and a circuit responsive to a current flowing through said second semiconductor device to detect said saturation of said power semiconductor device.

In embodiments the second semiconductor device effectively enables measurement of the voltage across the power semiconductor device, allowing saturation (when the device is in its on-state) to be detected. In embodiments further circuitry, for example a controller, may then control the power semiconductor device to turn it off before any significant damage occurs. In embodiments the second semiconductor device is connected across the drain-source, collector-emitter or anode-cathode terminals of the power semiconductor device, that is across the input and output terminals of the device. The power device generally also has a control terminal such as a gate or base connection for controlling switching of the device (although in some embodiments the power semiconductor device may comprise a two-terminal device).

In some preferred embodiments the second semiconductor device is connected in series with a resistor across the input and output terminals of the power semiconductor device. In this way the power device reaches saturation before the second device (although the resistor is not essential, depending upon the configuration of the two devices). Preferably the current flowing through the second semiconductor device is compared with a reference current to detect saturation of the power device. In preferred embodiments a third semiconductor device substantially matched to the second device is used to generate this reference current. Conveniently the current through the second semiconductor device is mirrored by a first current mirror, and the current through the third semiconductor device is mirrored by a second current mirror. These two mirrored currents may then by converted to respective voltages by respective resistors, and a voltage comparator may then be employed to compare the voltages to (indirectly) compare the currents to detect saturation.

Another problem which can arise relates to the interface of the drain or collector terminal of the power switch with low voltage, for example CMOS, sense circuitry. When the power device is on, the source-drain (or emitter-collector) voltage can, through a potential divider, be kept well within the low voltage CMOS sense circuitry's supply rails. However, depending upon the application, when the power switch turns off the drain/collector terminal can reach very high voltages, for example up to 700 volts in SMPS (switch mode power supply) applications. This can destroy the CMOS sense circuitry attached to the drain.

In embodiments the inclusion of the second semiconductor device, for example a high-voltage IGBT or MOSFET, in series with the drain/collector can be used to disconnect the CMOS sense circuitry from the drain/collector terminal under high-voltage conditions. Furthermore, using the applicant's particularly advantageous technology as described, for example, in WO 02/25700 (ibid) the two semiconductor devices can easily be fabricated on a common substrate. More particularly the power semiconductor device and the saturation detection circuit can easily be included within a single power integrated circuit, that is on a single, common substrate.

Preferably therefore a control circuit is also provided to control the switching of the power semiconductor device and of the second semiconductor device and, in particular, to switch off the second semiconductor device before switching off the power semiconductor device. More generally the timing of switching of the power and second devices can be arranged so that it is non-overlapping.

As previously mentioned, preferably the power, second and third semiconductor devices all comprise high-voltage devices, in particular suitable for operation at voltages of at least 100 volts, more preferably at least 300 volts, 400 volts, 500 volts or greater. Advantageously either IGBTs or MOSFETs may be employed. However, the skilled person will understand that other types of power device may also be employed including, for example, a high voltage diode, thyristor, Lilet (Lateral Inversion Layer Emitter Thyristor), SCR rectifier, LDMOSFET (Lateral Double Diffused MOSFET), Super Junction LDMOSFET and the like. Preferably, for ease of integration, the power, second and third semiconductor devices comprise lateral rather than vertical devices.

In certain embodiments, the invention also provides a power integrated circuit including a saturation detection circuit as described above.

Thus in a further aspect the invention provides a semiconductor-on-insulator power integrated circuit comprising a pair of high-voltage semiconductor devices, a first power device and a second device connected across said first device for detecting saturation of said first device.

The second device is connected in parallel with the first, power device, that is each of the devices has input and output terminals which are coupled in parallel, preferably connected via a resistor and/or a transistor for current mirroring.

In a further aspect the invention also provides a saturation detection circuit for detecting saturation of a first semiconductor device, the circuit comprising a second semiconductor device for connection across input and output terminals of said first semiconductor device to provide a sensing current responsive to a voltage across said first semiconductor device; a third semiconductor device substantially matched to said second semiconductor device to generate a reference current; and a comparator to compare signals derived from said sensing current and said reference current to detect saturation of said first semiconductor device.

Preferred embodiments include a control circuit to control the first and second semiconductor devices to switch the second device off before switching the first device off.

In another aspect the invention provides a method of detecting saturation of a power semiconductor device when in a switched on state, the method comprising sensing a signal dependent upon a voltage across input and output terminals of said power semiconductor device to detect said saturation.

Preferably the sensing uses a sensing circuit which is substantially disconnected from the power semiconductor device when the power semiconductor device is switching. Preferably the method includes passing a current through a second semiconductor device connected across the first semiconductor device to generate the voltage-dependent signal. The sensing may comprise comparing the voltage-dependent signal with a reference.

In a further aspect the invention provides a circuit for detecting saturation of a power semiconductor device when in a switched on state, the circuit comprising a means for sensing a signal dependent upon a voltage across input and output terminals of said power semiconductor device to detect said saturation.

Preferably the circuit includes means for implementing the above described method features.

BRIEF DESCRIPTION OF THE DRAWINGS

These and other aspects of the invention will now be further described by way of example only, with reference to the accompanying figures in which.

DETAILED DESCRIPTION OF THE PREFERRED EMBODIMENT

Figure 1:
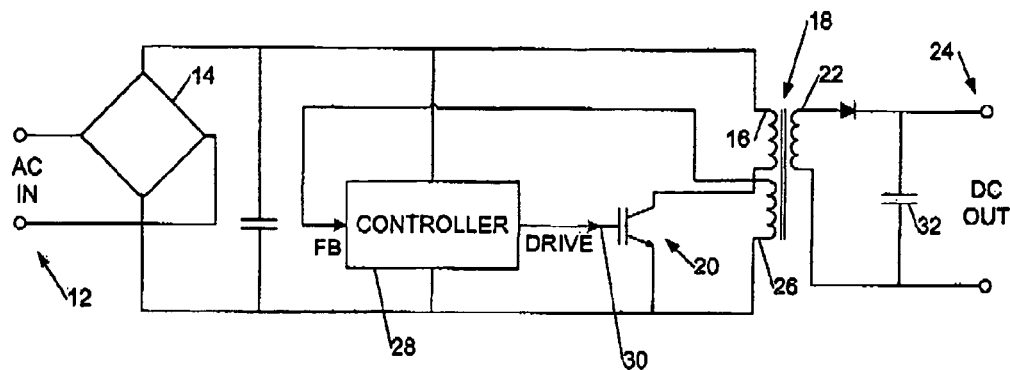
FIG. 1 shows an example of a typical switch mode power supply incorporating a power semiconductor device and switching controller.

Referring first to FIG. 1, this shows an example of a switch mode power supply circuit 10. This comprises an AC mains input 12 coupled to a bridge rectifier 14 to provide a DC supply to the input side of the power supply. This DC supply is switched across a primary winding 16 of a transformer 18 by means of a power switch 20, in this example an insulated gate bipolar transistor (IGBT). A secondary winding 22 of transformer 18 provides an AC output voltage which is rectified to provide a DC output 24, and an auxiliary winding 26 provides a feedback signal voltage proportionally to the voltage on secondary winding 22. This feedback signal provides an input to a control system 28, powered by the rectified mains. The control system provides a drive output 30 to the power switching device 20, modulating pulse width and/or pulse frequency to regulate the transfer of power through transformer 18, and hence the voltage of DC output 24. In embodiments the power switch 20 and controller 28 may be combined on a single power integrated circuit.

In operation, when power switch 20 is on the current in primary winding 16 ramps up storing energy in the magnetic field of transformer 18 and then when power switch 20 is opened there is a steep rise in the primary voltage (and hence also in the secondary voltage) as the transformer attempts to maintain its magnetic field; the spikes in the secondary voltage are smoothed by a smoothing circuit, typically an output capacitor 32. In the example of FIG. 1, a voltage at the output side of the power supply is inferred by sensing the state of the transformer by means of an auxiliary winding, and the circuit operates in a dynamic or discontinuous conduction mode. However similar switch mode power supplies may operate in a static or continuous conduction mode, in which the secondary or output side voltage is monitored to provide feedback, typically using an opto-isolator.

It is generally desirable to improve the current density and switching speed of the power device, in particular in a power integrated circuit implementation. However, these are limited by the saturation characteristic of the power switch and, furthermore, in order to maximise power device area and power handling it is useful to be able to operate the power switch (in FIG. 1 an LIGBT) at close to its saturation limit. However, as mentioned above, existing current sense solutions using current sense resistors or drift region taps do not permit reliable operation close to saturation. Saturation current is highly dependent on gate drive voltage and temperature and with existing techniques can only be limited for a worst case condition (low gate voltage, high temperature), which does not achieve any optimally sized power device. The inventors have recognised, however, that the saturation on-state voltage of a power semiconductor switch such as an LIGBT does not change significantly with current, so that if the collector or drain voltage could be monitored in the on-state, it should be possible to protect the power switching device from hard saturation under substantially any condition. We describe below a circuit for such saturation detection, which, in embodiments takes advantage of the applicant's particularly advantageous fabrication technology to integrate multiple high-voltage elements monolithically.

Figure 2:
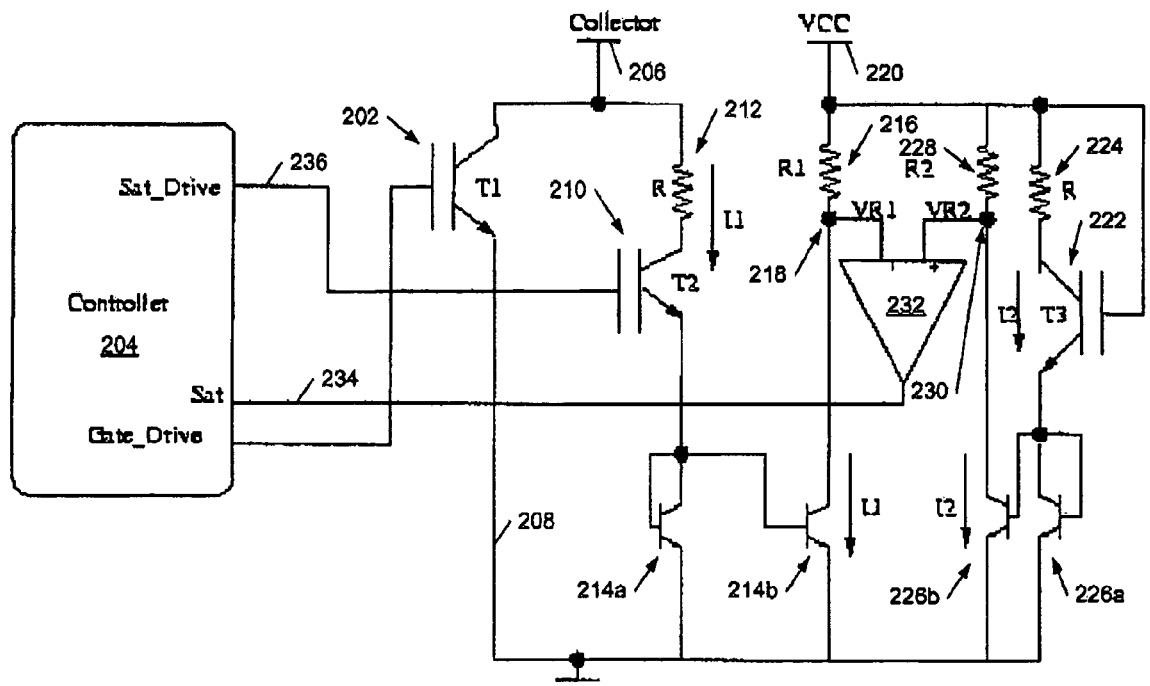
FIG. 2 shows an example saturation detection circuit according to an embodiment of the invention.

Referring now to FIG. 2, this shows an embodiment of a saturation detection circuit 200 according to the invention.

In the circuit of FIG. 2, the power switching device 202 comprises a high-voltage LIGBT with a gate drive from controller 204. In the on-state of device 202 a current flows from the external circuitry into the collector terminal 206 of the power device, typically integrated into a power integrated circuit, to the emitter 208, which is connected to ground. A forward voltage exists between the collector and emitter in this condition.

A second semiconductor device 210, in this example an IGBT, is connected across the power device 202 in series with a resistor 212 of value R, and a bipolar transistor 214a, which forms the input to a current mirror, the output of which is provided by bipolar transistor 214b. When IGBT 210 is switched on a current I1, flows through device 210, and this is mirrored by transistor 214b. This current flows through a resistor 216 of value R1 to convert the current into a first voltage VR1 at node 218.

The controller has a supply voltage VCC on supply rail 220. This biases a third semiconductor device 222, preferably identical to the second semiconductor device 210, in the example of FIG. 2 a third IGBT. Shorting the gate of IGBT 222 to the supply line 220 generates a reference current of magnitude I2 through resistor 224, also of value R. This reference current provides an input to a current mirror comprising transistors 226a, b, transistor 226b providing a mirrored output reference current I2. Current I2 flows through a further resistor 228, of value R2, to generate a voltage VR2 at node 230.

The voltages at nodes 218 and 230 are compared by comparator 232 which provides an output 234 to controller 204 to detect saturation of power switching device 202. This may be employed, for example to control the gate drive to power device 202 so that the power switch does not go into saturation.

In preferred embodiments the second semiconductor device 210 is controlled by an output 236 from controller 204 to synchronise the switching of devices 210 and 202 so that device 210 is not on when power switch 202 is switching, in particular switching off.

We next explain the operation of the circuit of FIG. 2.

As previously mentioned, when power device 202 is in its on-state a forward voltage exists between its input and output terminals and, with second device (IGBT) 210 switched on, a current I1 flows, the magnitude of which is dependent on the input terminal (in this example collector) voltage, Vc, as shown below:

$$I1 = (Vc - Vbe)/(Ron + R) \quad (1)$$

where Vbe is the voltage across the diode connected NPN transistor 214a and Ron is the on-resistance of IGBT 210.

In order to avoid device 210 (T2) from reaching saturation, before power device 202 (T1) reaches saturation a resistance R is preferably added in series with device T2. The current, I1, is mirrored as described above across R1 to generate a voltage VR1 given by:

$$VR1 = VCC - (Vc - Vbe)/(Ron + R) * R1 \quad (2)$$

This voltage is compared against a reference voltage VR2 where $$VR2 = VCC - I2 * R2 \quad (3)$$

The reference current I2 is generated by the third semiconductor device 222 (IGBT, T3), which is substantially identical to device T2, with its gate shorted to the supply voltage of the controller (VCC). The reference current I2 is therefore given by $$I2 = (VCC - Vbe)/(Ron + R) \quad (4)$$

Substituting this in equation 3 we obtain:

$$VR2 = VCC - (VCC - Vbe)/(Ron + R) * R2 \quad (5)$$

From equations 2 and 5 the on-state voltage required to turn on the comparator is therefore given by:

$$Vc = VCC(R2/R1) - Vbe(1 - R2/R1) \quad (6)$$

which can be seen to be independent of the on-resistance of the second semiconductor device, IGBT 210.

As mentioned above, the comparator output is connected to a control circuit (controller 204), which can turn the power device 202 (T1) off by pulling the Gate-drive signal low whenever the collector voltage exceeds the threshold voltage. This will protect the power device (T1) from a too-high collector-emitter voltage, as could otherwise occur in saturation.

Devices 210 and 222 (IGBTS T2 and T3) are important. Preferably both are small and substantially identical devices, for example high-voltage IGBTs fabricated using the Applicant's particularly advantageous ("PowerBrane"—trade mark) technology mentioned above. Devices 210 and 222 (T2 and T3) can be very small in size as the value of $R_{on}$ does not affect the measurement.

Device 210 (transistor T2) is controlled by the control circuit 204 using Sat_drive 236. In order to measured the power device voltage (LIGBT emitter-collector voltage) the second device 210 (T2) is turned on (Sat-drive 236 is high). Preferably device 210 (T2) is turned off by the CMOS control circuit 204 just before power device 202 (T1) is turned off. This isolates the low-voltage CMOS controller circuitry from the potentially destructive high-voltages on the power switching device (T1's emitter): When the power switching device (T1) is turned-off its emitter can reach voltages up to 700V in SMPS (switch mode power supply) applications. Preferably device 210 (T2) is turned on just after the power switch 202 (T1) is turned-on. The timing of the T1 and T2 switches can be used to achieve leading and/or falling edge blanking, and preferably a non-overlap time is observed for maximum reliability and robustness.

The skilled person will understand that same principles as those described above can be used in measuring and/or controlling saturation voltage in a circuit using high voltage MOSFETS.

Broadly speaking, in preferred embodiments of the circuits and methods we describe, the collector-emitter voltage of an IGBT or drain-source voltage of a MOSFET is measured to control and prevent saturation. A high-voltage device, preferably formed using monolithic high-voltage technology, is used to isolate low-voltage sense circuitry, for example fabricated in CMOS, bipolar, or BiCMOS technology. The threshold voltage for the comparator is, in embodiments, dependent upon a supply rail (VCC) voltage. Broadly speaking, the inventors have recognised that measuring the on-state voltage across a power-switching device can be used to control/prevent saturation of the power device.

Embodiments of the above described saturation detection circuit facilitate maximum utilisation of a power switch such as an LIGBT, by facilitating operation of the switch safely close to its maximum current handling (saturation). Embodiments of the circuit make a substantially lossless measurement (because there is no current sense resistor) thus allowing increased system efficiencies.

No doubt many other effective alternatives will occur to the skilled person. It will be understood that the invention is not limited to the described embodiments and encompasses modifications apparent to those skilled in the art lying within the spirit and scope of the claims appended hereto.

What is claimed is:

1. A saturation detection circuit for detecting saturation of a first semiconductor device, the circuit comprising:
    a second semiconductor device for connection across input and output terminals of said first semiconductor device to provide a sensing current responsive to a voltage across said first semiconductor device;
    a third semiconductor device substantially matched to said second semiconductor device to generate a reference current; and
    a comparator to compare signals derived from said sensing current and said reference current to detect saturation of said first semiconductor device.

2. A saturation detection circuit as claimed in claim 1 further comprising a control circuit to control said first and second semiconductor devices to substantially switch said second semiconductor device off before switching said first semiconductor device off.

* * * * *